(12) United States Patent
Ecton et al.

(10) Patent No.: US 12,027,466 B2
(45) Date of Patent: Jul. 2, 2024

(54) CONDUCTIVE ROUTE PATTERNING FOR ELECTRONIC SUBSTRATES

(71) Applicant: Intel Corporation, Santa Clara, CA (US)

(72) Inventors: Jeremy D. Ecton, Gilbert, AZ (US); Aleksandar Aleksov, Chandler, AZ (US); Brandon C. Marin, Chandler, AZ (US); Yonggang Li, Chandler, AZ (US); Leonel Arana, Phoenix, AZ (US); Suddhasattwa Nad, Chandler, AZ (US); Haobo Chen, Chandler, AZ (US); Tarek Ibrahim, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 694 days.

(21) Appl. No.: 17/026,703

(22) Filed: Sep. 21, 2020

(65) Prior Publication Data

US 2022/0093520 A1 Mar. 24, 2022

(51) Int. Cl.
*H01L 23/538* (2006.01)
*H01L 21/768* (2006.01)
*H05K 1/11* (2006.01)

(52) U.S. Cl.
CPC .... *H01L 23/5386* (2013.01); *H01L 21/76838* (2013.01); *H01L 23/5385* (2013.01); *H05K 1/11* (2013.01)

(58) Field of Classification Search
CPC ............. H01L 23/5386; H01L 23/5385; H01L 23/49838; H01L 23/49822; H01L 21/76838; H01L 21/4846; H01L 21/4857; H01L 2224/16225; H01L 2924/15174; H01L 2924/15311; H05K 1/11; H05K 1/181; H05K 3/3436; H05K 2201/10734
See application file for complete search history.

(56) References Cited

U.S. PATENT DOCUMENTS

| | | | | |
|---|---|---|---|---|
| 6,459,039 B1 * | 10/2002 | Bezama | ............ | H01L 23/49827 439/91 |
| 7,915,537 B1 * | 3/2011 | Herbert | ............. | H01L 23/49838 174/262 |
| 2010/0065314 A1 * | 3/2010 | Lin | ..................... | H05K 3/4661 430/313 |

FOREIGN PATENT DOCUMENTS

CN 1247635 A * 3/2000 ........... H01L 21/486

* cited by examiner

*Primary Examiner* — Sitaramarao S Yechuri
(74) *Attorney, Agent, or Firm* — Essential Patents Group, LLP

(57) ABSTRACT

Conductive routes for an electronic substrate may be fabricated by forming an opening in a material, using existing laser drilling or lithography tools and materials, followed by selectively plating a metal on the sidewalls of the opening. The processes of the present description may result in significantly higher patterning resolution or feature scaling (up to 2× improvement in patterning density/resolution). In addition to improved patterning resolution, the embodiments of the present description may also result in higher aspect ratios of the conductive routes, which can result in improved signaling, reduced latency, and improved yield.

20 Claims, 17 Drawing Sheets

CONDUCTIVE ROUTE PATTERNING FOR ELECTRONIC SUBSTRATES

TECHNICAL FIELD

Embodiments of the present description generally relate to the field of integrated circuit package or assembly fabrication, and, more specifically, to the fabrication of conductive routes or metallization in electronic substrates used to route electrical signals for integrated circuit packages or assemblies.

BACKGROUND

Electronic substrates, used in the fabrication of integrated circuit assemblies, are generally composed of alternating layers of dielectric material (such as organic materials) and metal (such as copper) which is patterned to form conductive routes. At least one integrated circuit device, such as a silicon die having integrated circuitry formed therein, may be physically and electrically attached to the electronic substrate, such that the conductive routes in the electronic substrate appropriately route electrical signals to and from the integrated circuitry of the integrated circuit device(s).

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the conductive routes within the electronic substrates, to which the integrated circuit devices are electrically attached, must also because smaller, in terms of pitch and line spacing (known as "line/space resolution"), as will be understood to those skilled in the art, in order to reduce the size of the integrated circuit packages or assemblies.

Existing materials and lithography/laser patterning equipment are limited in terms of patterning resolution. Thus, in order to meet future conductive route size requirements, new processes, new tools and/or new materials will be needed to enable higher patterning resolution. Additionally, it is noted that as features decrease is size, yield becomes more challenging due to the larger density of patterned features, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
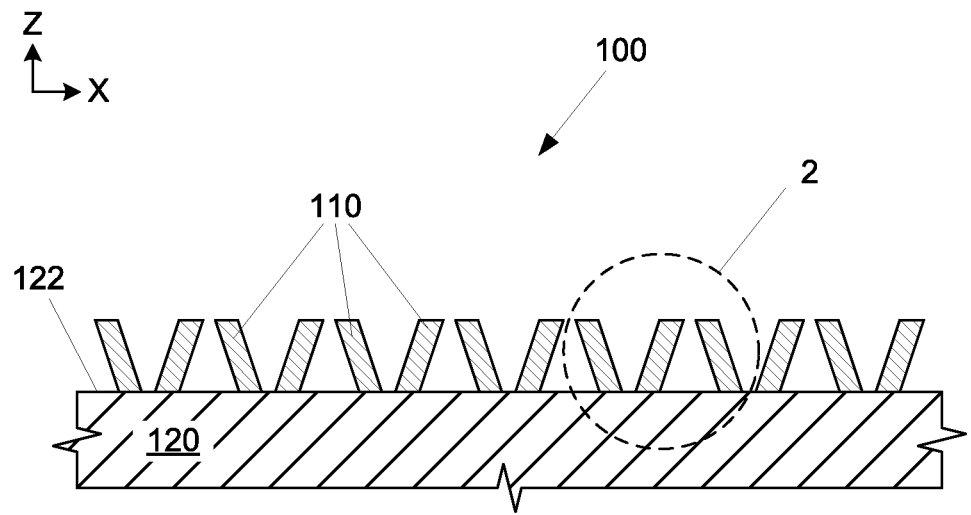
FIG. 1 is a side cross-sectional view of conductive routes for an electronic substrate, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of conductive routes for an electronic substrate. These conductive routes may be fabricated by forming an opening in a material, using existing laser drilling or lithography tools and materials, followed by selectively plating a metal on the sidewalls of the opening. The processes of the present description may result in significantly higher patterning resolution or feature scaling (up to 2× improvement in patterning density/resolution). In addition to improved patterning resolution, the embodiments of the present description may also result in higher aspect ratios of the conductive routes, which can result in improved signaling, reduced latency, and improved yield (e.g. the higher patterning density is achieved with a lower lithography or laser patterning density techniques, so there will be no yield loss that would be associated with higher patterning density techniques).

Figure 2:
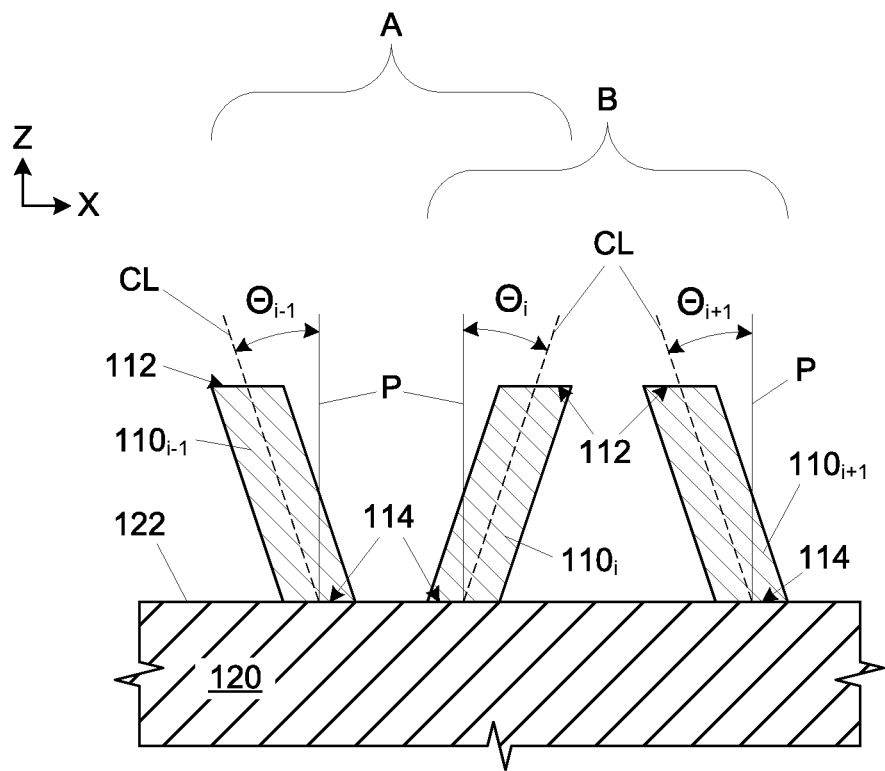
FIG. 2 is a side cross-sectional view of inset 2 of FIG. 1, according to an embodiment of the present description.

FIG. 1 illustrates high-density conductive routes 110 formed on a first surface 122 of a base substrate 120 of an electronic substrate 100, according to one embodiment of the present description. The base substrate 120 may be any appropriate structure, including, but not limited to, an interposer, a motherboard, an inert carrier, and the like. As will be subsequently discussed, the high-density conductive routes 110 may be fabricated by either a laser-based approach/method or a lithography-based approach/method. With both approaches, a similar structure of alternating "slanting" conductive routes 110 will be formed. Both of the approaches result in parallel, ordered pairs of conductive routes (e.g. like railroad tracks) that are mirror-images or inverted relative to one another. As shown in FIG. 2, if a laser-based method is used, an ordered pair A, e.g. conductive routes $110_{i-1}$ and $110_i$, will be formed, wherein first ends 112 (farthest from the base substrate 120) of the conductive routes $110_{i-1}$ and $110_i$ will be farther apart than the second ends 114 thereof (adjacent or abutting the base substrate 120) in an inverted relationship. If a lithography-based method is used, an ordered pair B, e.g. high-density conductive routes $110_i$ and $110_{i+1}$, will be formed, wherein the first ends 112 (farthest from the base substrate 120) of the high-density conductive routes $110_i$ and $110_{i+1}$ will be closer together than the second ends 114 thereof (adjacent or abutting the base substrate 120) in an inverted relationship. Regardless of the method used, each of the high-density conductive routes (e.g. elements $110_{i-1}$, $110_i$, and $110_{i+1}$), in cross-section, will have a centerline CL extending from the first end 112 to the second end 114, which will be "slanted". In other words, the centerline CL of each of the high-density conductive routes $110_{i-1}$, $110_i$, and $110_{i+1}$, will be angled (i.e. angles $\Theta_{i-1}$, $\Theta_i$, and $\Theta_{i+1}$, respectively) off of a direction or reference line P that is substantially perpendicular to the first surface 122 of the base substrate 120. Of course, due to the inverted nature of the orientation, angle $\Theta_{i-1}$, will be substantially equal to angle $\theta_i$, which will be substantially equal to angle $\theta_{i+1}$. In one embodiment of the present description, $\Theta_i$ may be between about 1 degree and 45 degrees. In a further embodiment of the present description, $\Theta_i$ may be greater than about 5 degrees.

Figure 3:
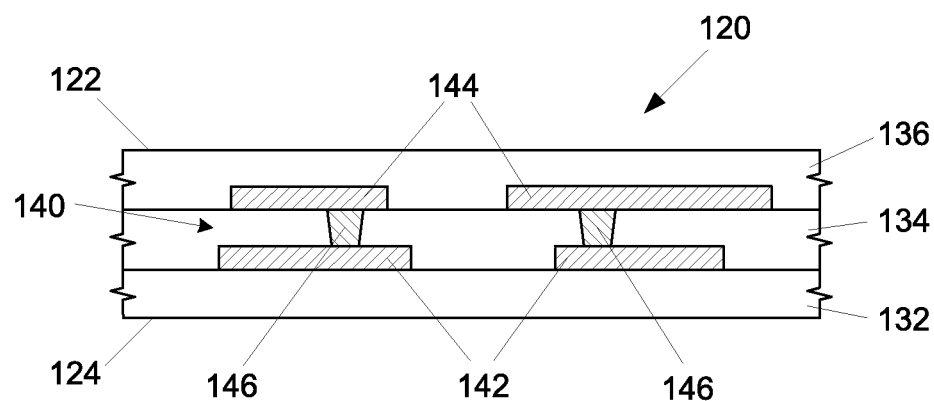
FIGS. 3-17 are side cross-sectional views of a process for the fabrication of conductive routes for an electronic substrate, according to an embodiment of the present description.

FIGS. 3-17 illustrate a lithography-based process for fabricating conductive routes for an electronic substrate, according to an embodiment of the present description. FIG. 3 illustrates the base substrate 120 having the first surface 122 and an opposing second surface 124. The base substrate 120 may be any appropriate structure or carrier. However, as the electronic substrate may require both coarse conductive routes using conventional fabrication (i.e. to create bond pads and other coarse features), as well as the high-density conductive routes of the present description, the base substrate 120 will be described as being formed with coarse conductive routes. Thus, the base substrate 120 may comprise a plurality of dielectric material layers (illustrated as a first dielectric material layer 132, a second dielectric material layer 134, and a third dielectric material layer 136), which may include build-up films and/or solder resist layers, and may be composed of any appropriate dielectric material, including, but not limited to, bismaleimide triazine resin, fire retardant grade 4 material, polyimide material, silica filled epoxy material, glass reinforced epoxy material, low temperature co-fired ceramic materials, and the like, as well as low-k and ultra low-k dielectrics (dielectric constants less than about 3.6), including, but not limited to, carbon doped dielectrics, fluorine doped dielectrics, porous dielectrics, organic polymeric dielectrics, fluoropolymers, and the like.

The base substrate 120 may further include conductive routes or "metallization" 140 extending through the base substrate 120. As will be understood to those skilled in the art, the conductive routes 140 may be a combination of conductive traces (shown as first level traces 142 and second level traces 144) and conductive vias (shown as vias 146) extending through the dielectric material layers. The fabrication of conductive traces and conductive vias are well known in the art and are not described for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the base substrate 120 may be a cored substrate or a coreless substrate.

Figure 4:
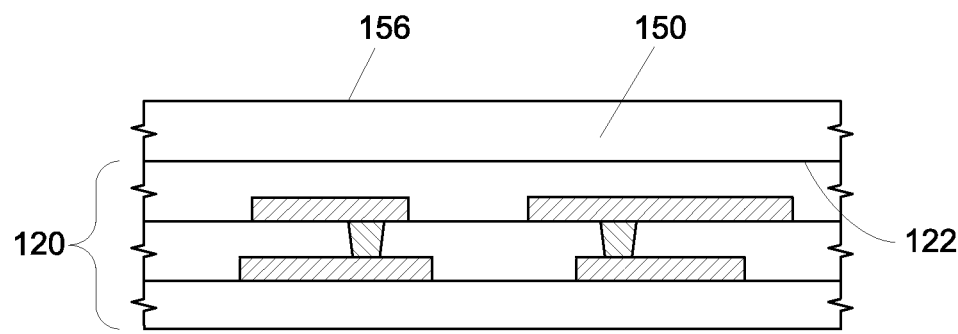

As shown in FIG. 4, a photoresist material layer 150 may be formed, such as by lamination, on the base substrate 120. The photoresist material layer 150 may be any appropriate photoresist material known in the art. In one embodiment of the present description, the photoresist material layer 150 may be a negative photoresist material.

Figure 5:
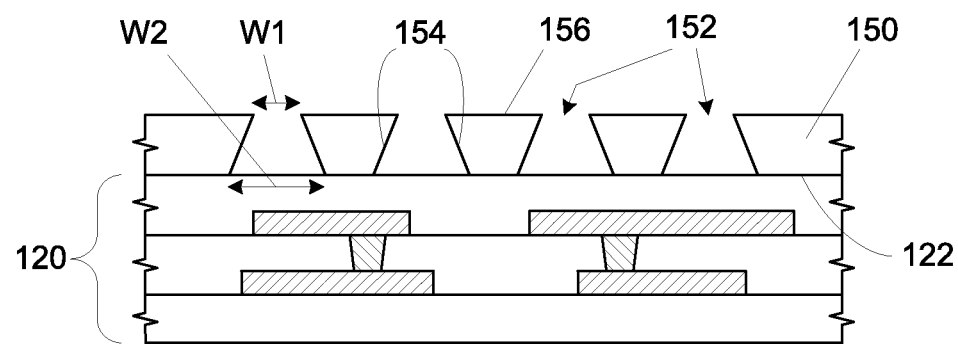

As shown in FIG. 5, the photoresist material layer 150 may be patterned by any known lithography tools to form at least one opening 152 therein, wherein the openings 152 will each have at least two opposing sidewalls 154 having a negative taper and expose portions of the first surface 122 of the base substrate 120. A negative taper occurs when a first width W1 of the openings 152 at an outer surface 156 of the photoresist material layer 150 is smaller than a second width W2 of the openings 152 at the first surface 122 of the base substrate 120. The formation of a negative taper may be an inherent result of the use of a negative photoresist material layer 150 and known lithographic patterning techniques.

Figure 6:
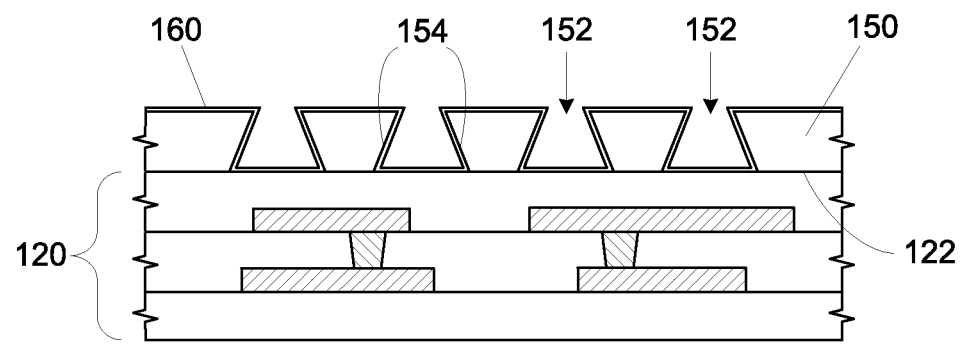

As shown in FIG. 6, a substantially conformal conductive material layer 160 may be formed on the photoresist material layer 150, on the sidewalls 154 of the photoresist material layer 150, and on the exposed portions of the first surface 122 of the base substrate 120. The conductive material layer 160 may be any appropriate material, including, but not limited to, metal, and may be formed by any appropriate method, including, but not limited to, plating. In one embodiment of the present description, the conductive material layer 160 may be electroless plated copper.

Figure 7:
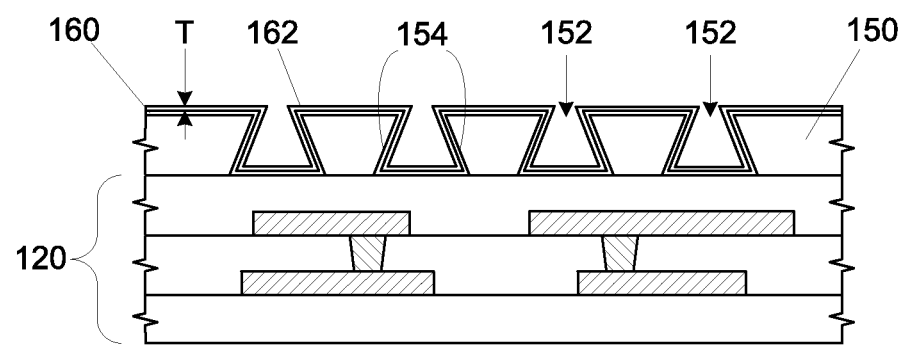

As shown in FIG. 7, a thin photoresist material layer 162 may be formed on the conductive material layer 160. The thin photoresist material layer 162 may be any appropriate photoresist material known in the art. In one embodiment of the present description, the thin photoresist material layer 162 may have a thickness T of less than about 0.5 microns, which may be deposited by a spray coating technique or by an electrodeposited resist. It is noted that due to the negative taper of the sidewalls 154 of the openings 152, the thin photoresist material layer 162 may be non-conformal or spotty adjacent to the sidewalls 154.

Figure 8:
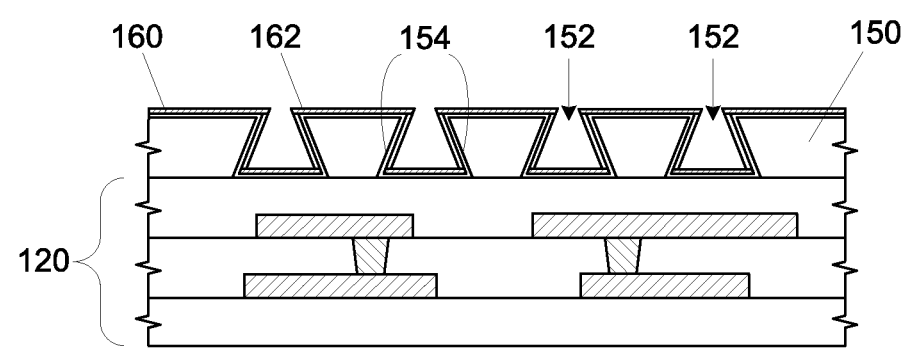
Figure 9:
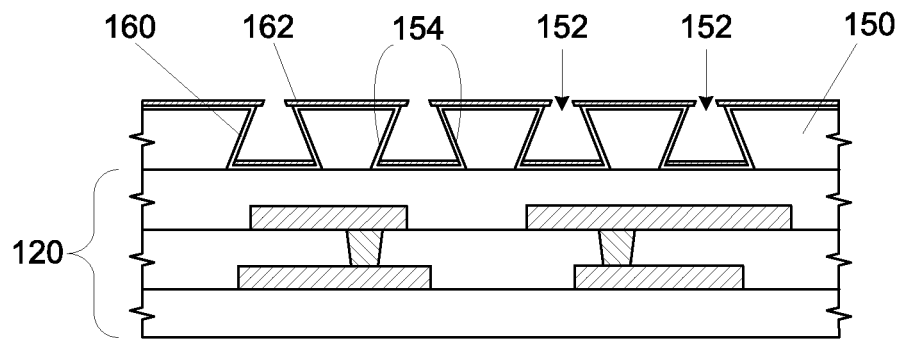

As shown in FIG. 8, portions of the thin photoresist material layer 162 may be flash cured. The cured portions of the thin photoresist material layer 162 are shown with shading. The portions of the thin photoresist material layer 162 adjacent to the sidewalls 154 will not be cured, as the negative taper of the sidewalls 154 will shade these surfaces from the flash cure. As shown in FIG. 9, the uncured thin photoresist material layer 162 may be removed to expose the conductive material layer 150 adjacent the sidewalls 154.

Figure 10:
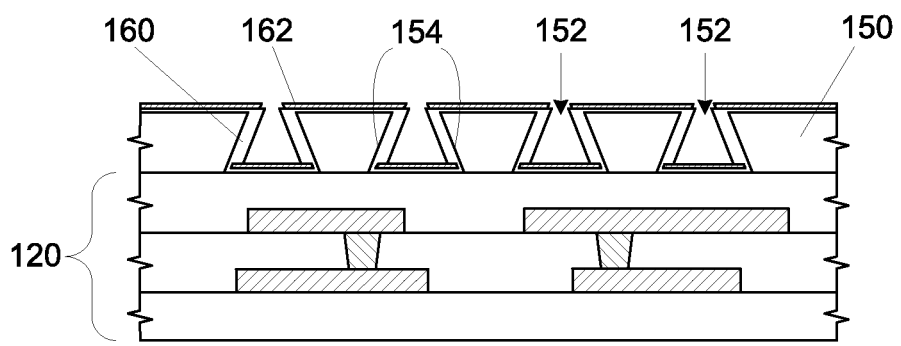

As shown in FIG. 10, a metal may be plated onto the exposed conductive material layer 160 (see FIG. 9) adjacent the sidewalls 154. In one embodiment of the present description, copper may be electrolytically plated onto the exposed conductive material layer 160 (see FIG. 9) to thicken the conductive material layer 160. The process described enables electrolytic copper plating, which potentially has better electrical performance over electroless copper plating.

Figure 11:
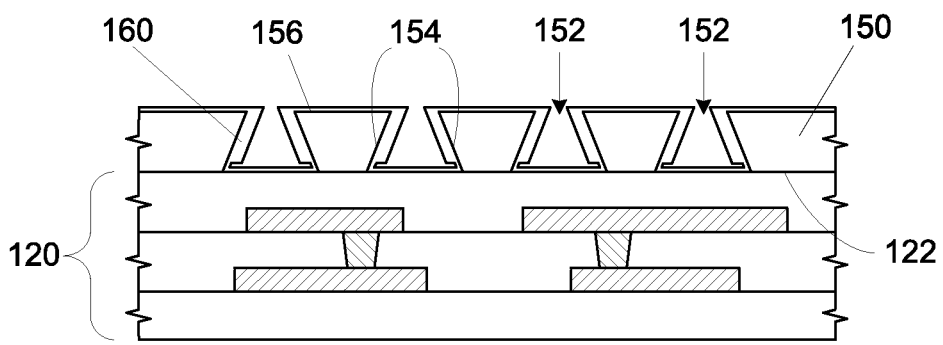
Figure 12:
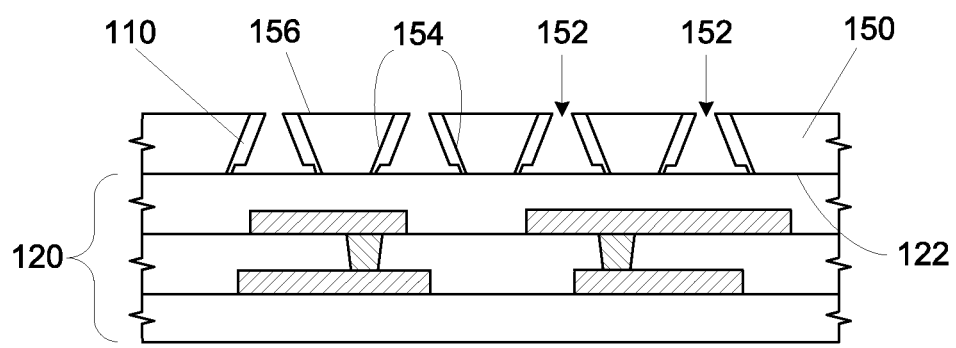

As shown in FIG. 11, the thin photoresist material layer 162 (see FIG. 10) may be removed, and the conductive material layer 160 may be flash etched to remove portions thereof abutting the outer surface 156 of the photoresist material layer 150 and abutting the first surface 122 of the based substrate 120, thereby forming the high-density conductive routes 110, as shown in FIG. 12.

Figure 13:
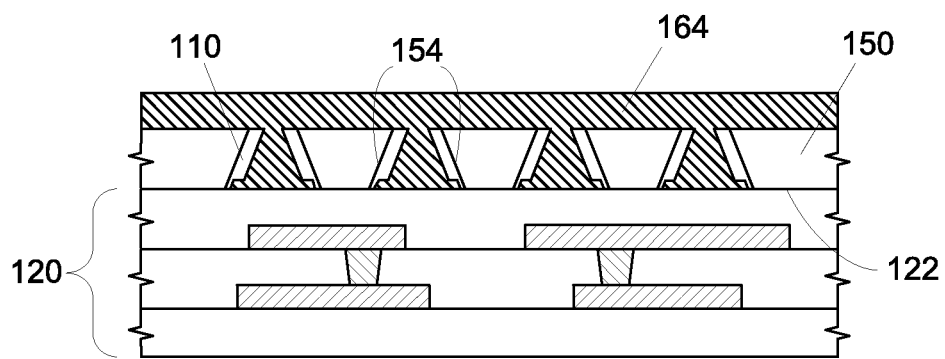
Figure 14:
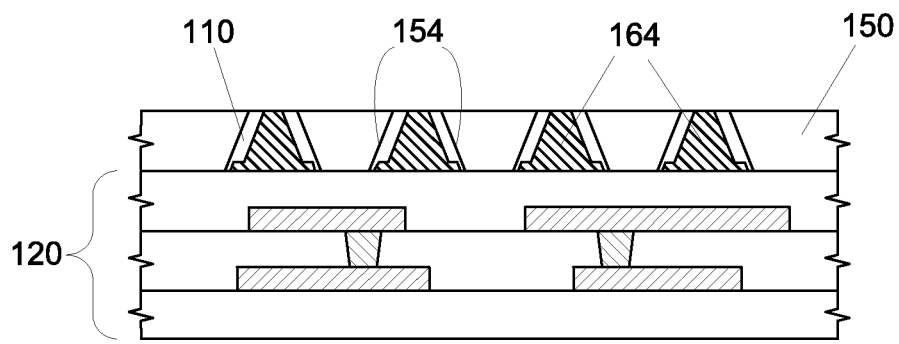
Figure 15:
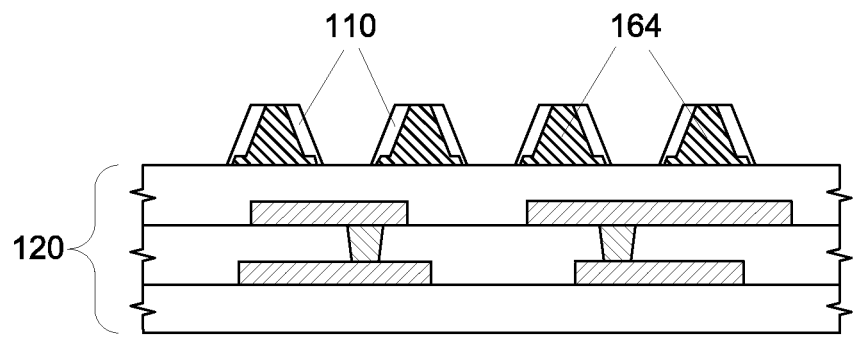
Figure 16:
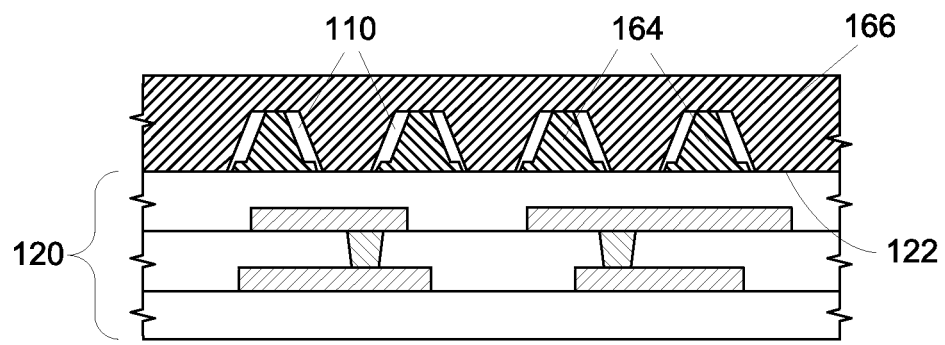
Figure 17:
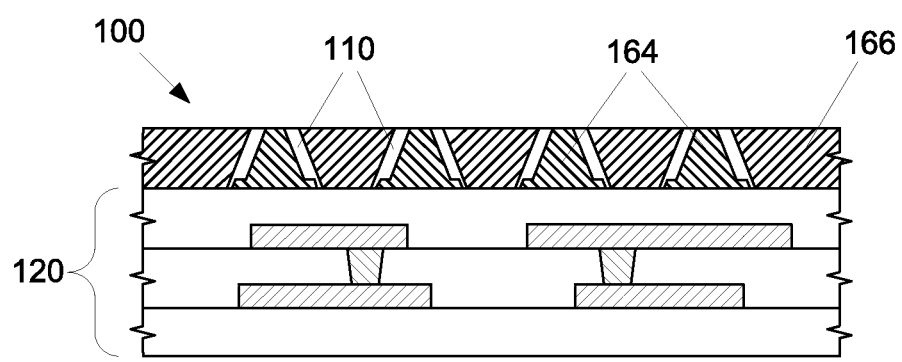

As shown in FIG. 13, a first dielectric material layer 164 may be formed on the photoresist material layer 150 and into the openings 152 (see FIG. 12). As shown in FIG. 14, the first dielectric material layer 164 may be planarized, such as by chemical mechanical polishing, to leave portions of the first dielectric material layer 164 in the openings 152 (see FIG. 12). As shown in FIG. 15, the photoresist material layer 150 (see FIG. 14) may be removed, and a second dielectric material layer 166 may be formed, such as by lamination, over the first surface 122 of the base substrate 120, as shown in FIG. 16. The second dielectric material layer 166 may then be planarized to form the electronic substrate 100, as shown in FIG. 17.

Figure 18:
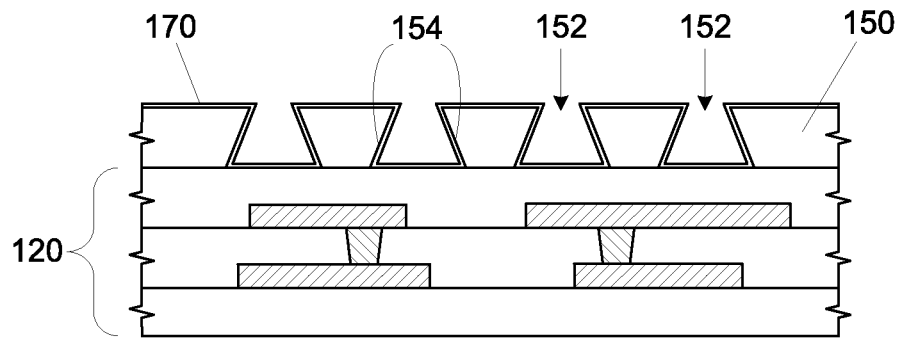
FIGS. 18-22 are side cross-sectional views of a process for the fabrication of conductive routes for an electronic substrate, according to one embodiment of the present description.

FIGS. 18-22 illustrate a lithography-based process for fabricating conductive routes for an electronic substrate for an integrated circuit assembly, according to an embodiment of the present description. Beginning with the structure illustrated in FIG. 5, as shown in FIG. 18, a seed material layer 170 may be formed on the photoresist material layer 150, on the sidewalls 154 of the photoresist material layer 150, and on the exposed portions of the first surface 122 of the base substrate 120. The seed material layer 170 may be any appropriate material, including, but not limited to, metal, and may be formed by any appropriate method, including, but not limited to, plating. In one embodiment of the present description, the seed material layer 170 may be electroless plated palladium. In another embodiment of the present description, the seed material layer 170 may be a liquid metal ink. In a specific embodiment, the liquid metal ink may comprise palladium.

Figure 19:
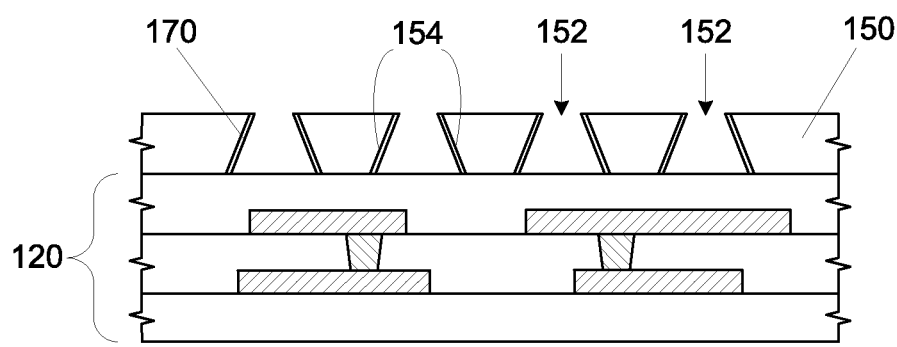

As shown in FIG. 19, the seed material layer 170 may be directionally etched, such as by laser ablation or reactive ion etching plasma. Due the negative taper of the sidewalls 154 of the openings 152, the seed material layer 170 will remain only adjacent to the sidewalls 154.

Figure 20:
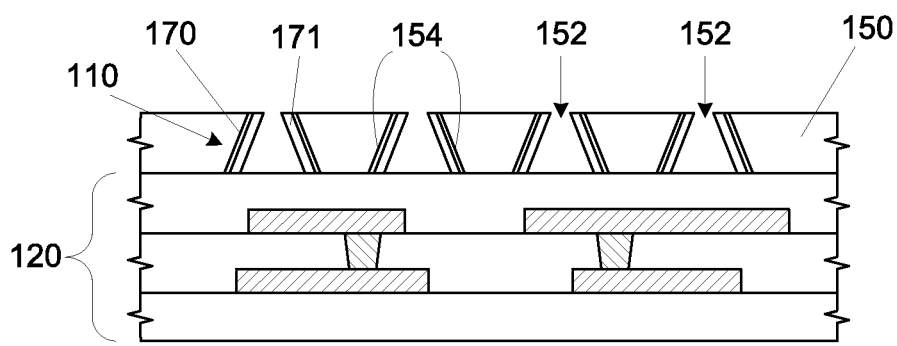
Figure 21:
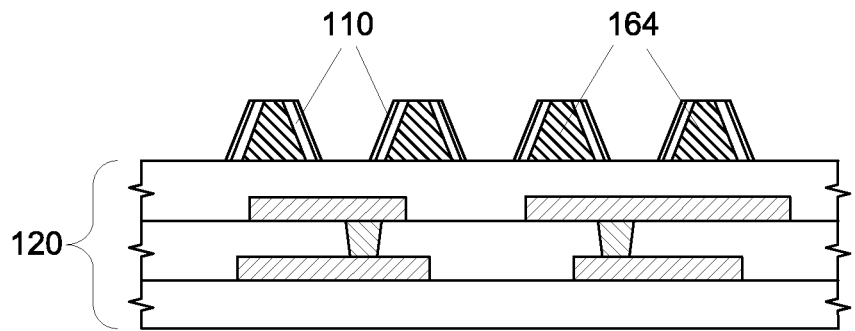
Figure 22:
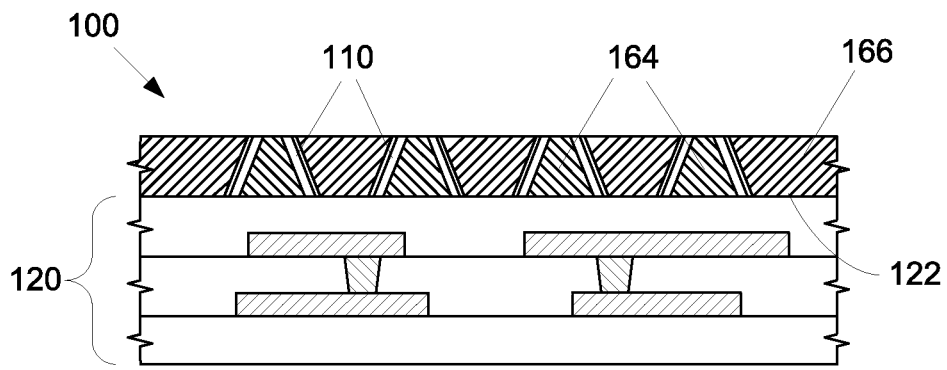

As shown in FIG. 20, a metal layer 171 may be plated onto the seed material layer 170 adjacent the sidewalls 154, thereby forming the high-density conductive routes 110. In one embodiment of the present description, the metal layer 171 may comprise copper that may be electrolessly plated onto the seed material layer 170 (see FIG. 19). In one embodiment, as shown, the seed material layer 170, particularly when is comprises palladium, may not be subsumed into the metal layer 171. As shown in FIG. 21, the first dielectric material layer 164 may be formed in the openings 152 (see FIG. 20) and the photoresist material layer 150 (see FIG. 20) removed, such as by the process described with regard to FIGS. 13 and 14. As shown in FIG. 22, the second dielectric material layer 166 may be formed, such as by lamination, on the first surface 122 of the base substrate 120, such as by the process shown in FIGS. 16 and 17.

Figure 23:
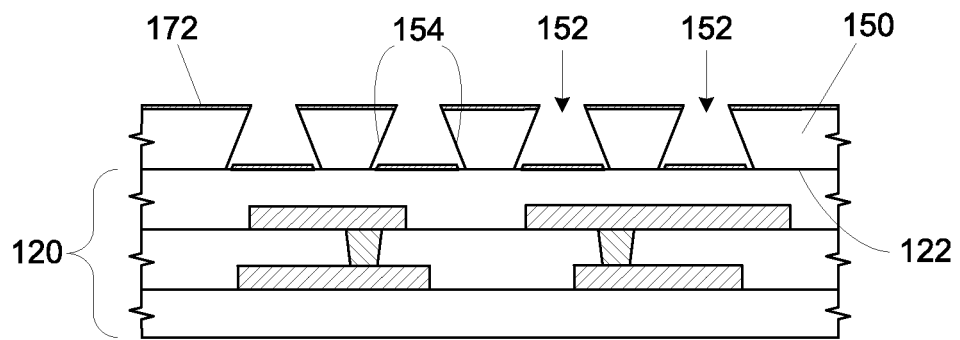
FIGS. 23-27 are side cross-sectional views of a process for the fabrication of conductive routes for an electronic substrate, according to another embodiment of the present description.

FIGS. 23-27 illustrate a lithography-based process for fabricating conductive routes for an electronic substrate for an integrated circuit assembly, according to a further embodiment of the present description. Beginning with the structure illustrated in FIG. 5, as shown in FIG. 23, a mask layer 172 may be formed on the photoresist material layer 150 and on the exposed portions of the first surface 122 of the base substrate 120. The mask layer 172 may be any appropriate material, including, but not limited to, metal, and may be formed by any appropriate method, including, but not limited to, sputtering. In one embodiment of the present description, the mask layer 172 may comprise a titanium material that is formed by sputtering. Due the negative taper of the sidewalls 154 of the openings 152, the sputtering of the mask layer 172 will result in the mask layer 172 not forming adjacent to the sidewalls 154.

Figure 24:
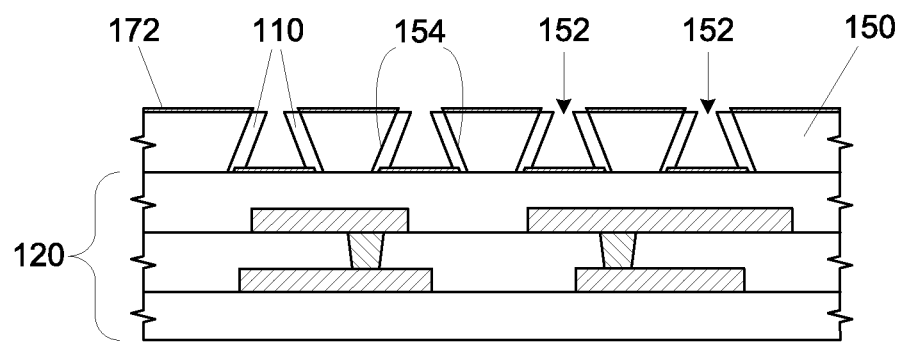
Figure 25:
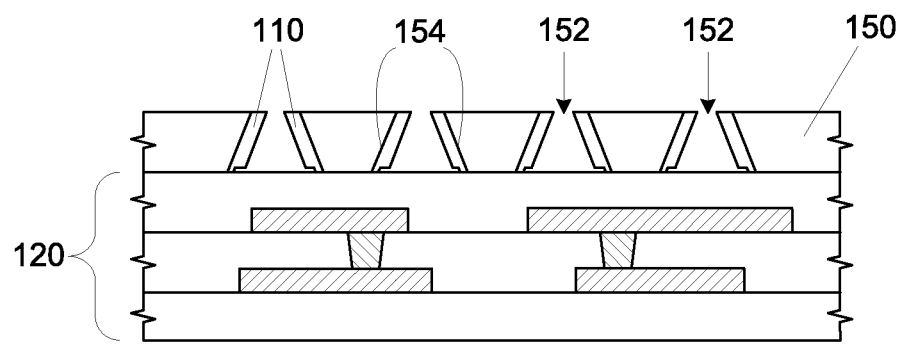
Figure 26:
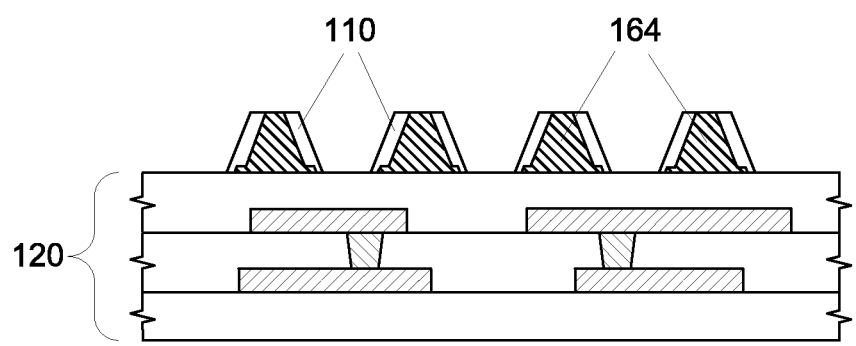
Figure 27:
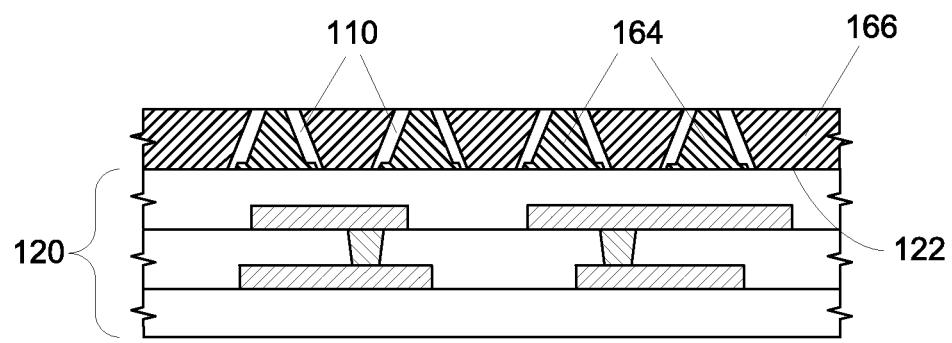

As shown in FIG. 24, a metal may be selectively plated onto the sidewalls 154 rather than the mask layer 172, thereby forming the high-density conductive routes 110. In one embodiment of the present description, copper may be electrolessly plated onto the sidewalls 154. As shown in FIG. 25, the mask layer 172 may be removed. It is understood that a portion of the mask layer 172 may remain within the openings 152. As shown in FIG. 26, the first dielectric material layer 164 may be formed in the openings 152 (see FIG. 25) and the photoresist material layer 150 (see FIG. 25) removed, such as by the process described with regard to FIGS. 13 and 14. As shown in FIG. 27, the second dielectric material layer 166 may be formed, such as by lamination, on the first surface 122 of the base substrate 120, such as by the process shown in FIGS. 16 and 17.

It is noted that in further embodiments, the photoresist material layer 150 may be replaced with a photo-imageable dielectric material to simplify the processes illustrated in FIGS. 3-27. A photo-imageable dielectric material may have better adhesion properties for electroless copper plating compared to the photoresist material layer 150.

Figure 28:
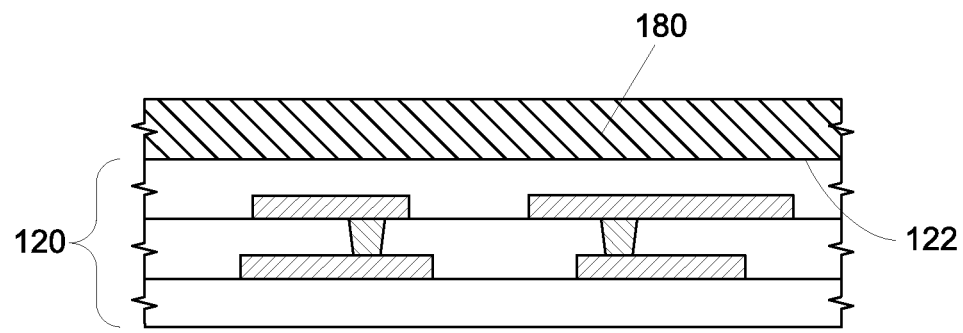
FIGS. 28-33 are side cross-sectional views of a process for the fabrication of conductive routes for an electronic substrate, according to one embodiment of the present description.
Figure 29:
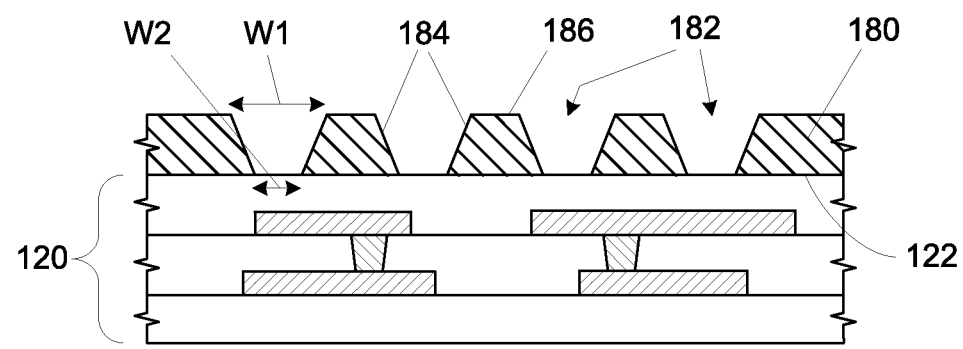

FIGS. 28-32 illustrate a laser-based process for fabricating conductive routes for an electronic substrate for an integrated circuit assembly, according to still a further embodiment of the present description. Beginning with the structure illustrated in FIG. 3, as shown in FIG. 28, an upper dielectric material layer 180 may be formed on the first surface 122 of the base substrate 120. As shown in FIG. 29, the upper dielectric material layer 180 may be laser drilled to form at least one opening 182 therein, wherein the openings 182 will each have at least two opposing sidewalls 184 having a positive taper and expose portions of the first surface 122 of the base substrate 120. A positive taper occurs when a first width W1 of the openings 182 at an outer surface 186 of the upper dielectric material layer 180 is greater than a second width W2 of the openings 182 at the first surface 122 of the base substrate 120. The formation of a positive taper may be an inherent result of the laser drilling to form the openings 182.

Figure 30:
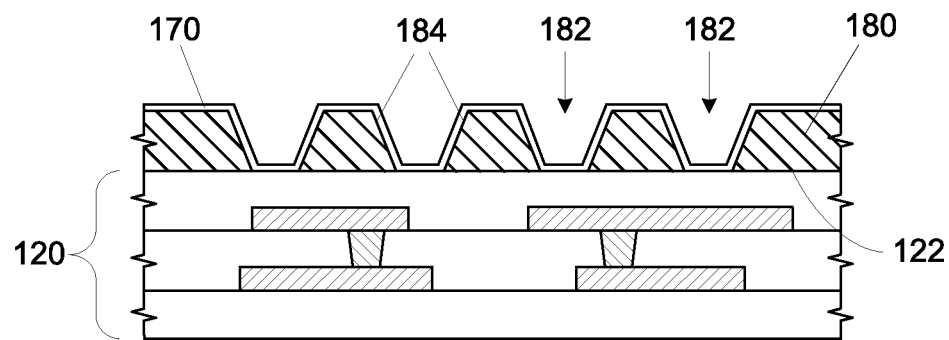

As shown in FIG. 30, the seed material layer 170 may be formed on the upper dielectric material layer 180, on the sidewalls 184 of the openings 182 in the upper dielectric material layer 180, and on the exposed portions of the first surface 122 of the base substrate 120. The seed material layer 170 may be any appropriate material, including, but not limited to, metal, and may be formed by any appropriate method, including, but not limited to, deposition. In one embodiment of the present description, the seed material layer 170 may comprise palladium.

Figure 31:
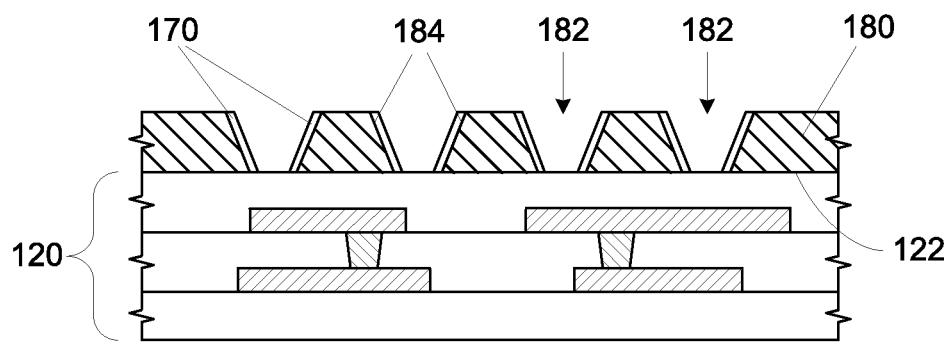
Figure 32:
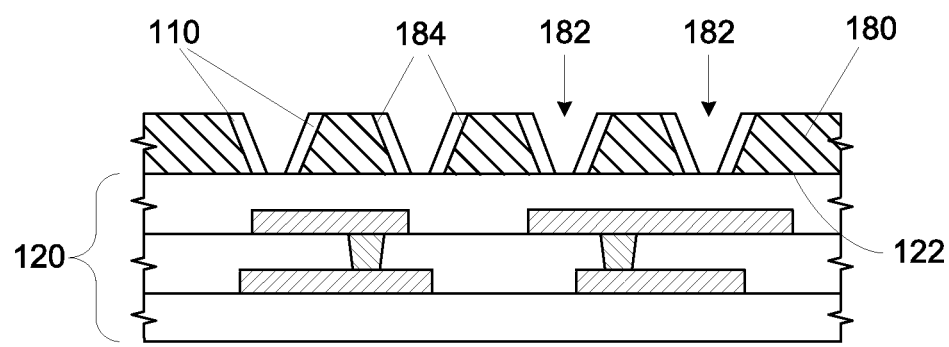
Figure 33:
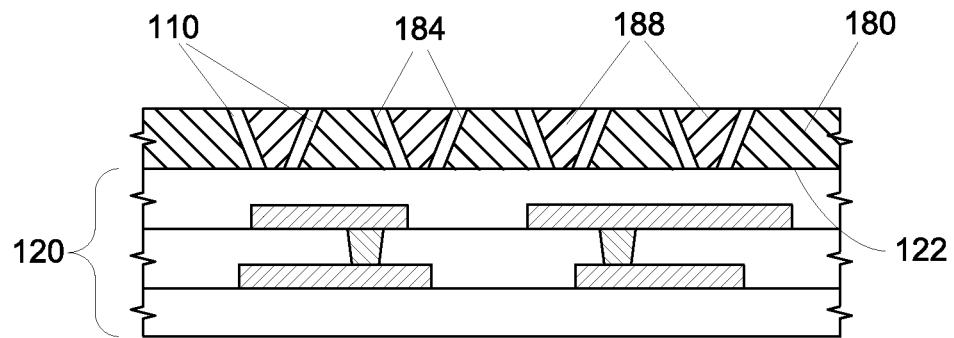

As shown in FIG. 31, the seed material layer 170 may be subjected to a blanket laser sweep to remove portions thereof on horizontal surface, e.g. all surfaces except on the sidewalls 184. As shown in FIG. 32, a metal may be selectively plated onto seed material layer 170 (see FIG. 31) on the sidewalls 184, thereby forming the high-density conductive routes 110. In one embodiment of the present description, copper may be electrolessly plated onto the sidewalls 184. As shown in FIG. 33, a fill dielectric material layer 188 may be formed in the openings 182 (see FIG. 32) and planarized.

Figure 34:
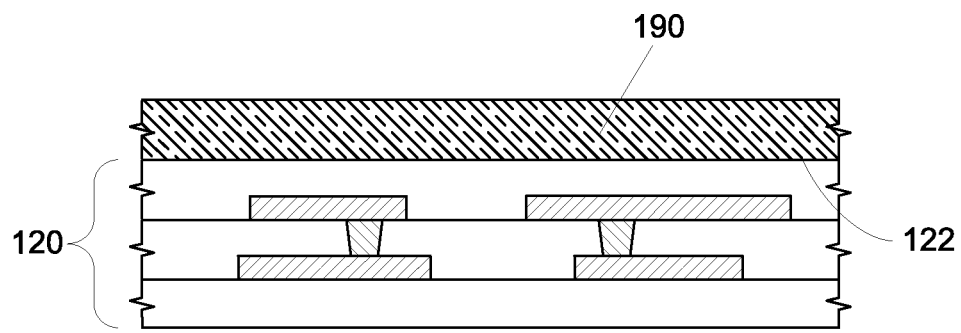
FIGS. 34-38 are side cross-sectional views of a process for the fabrication of conductive routes for an electronic substrate, according to another embodiment of the present description.
Figure 35:
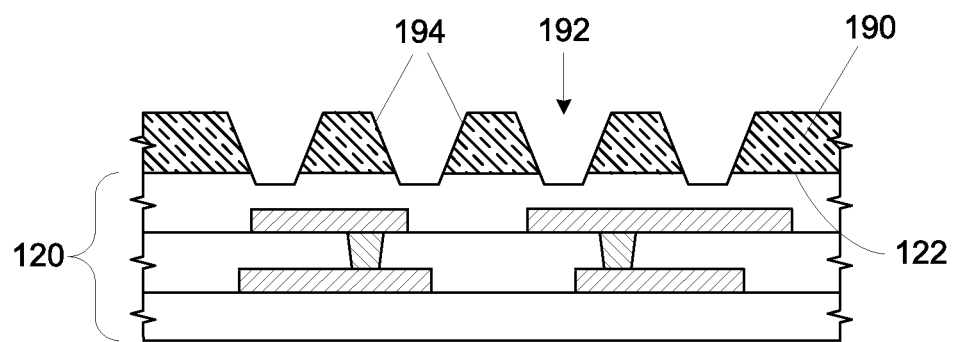
Figure 36:
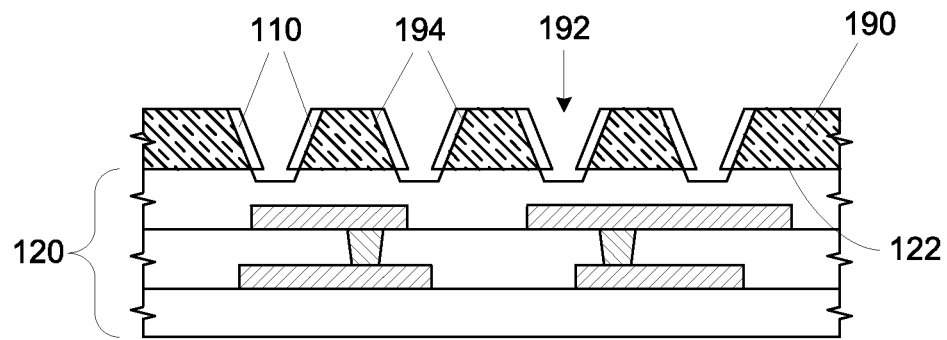
Figure 37:
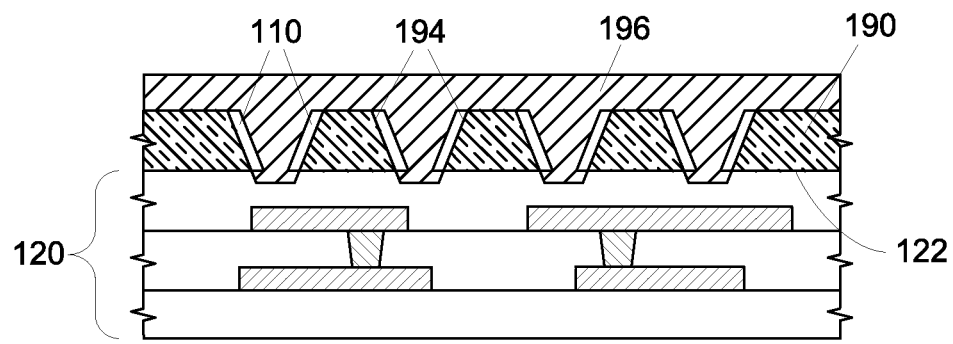
Figure 38:
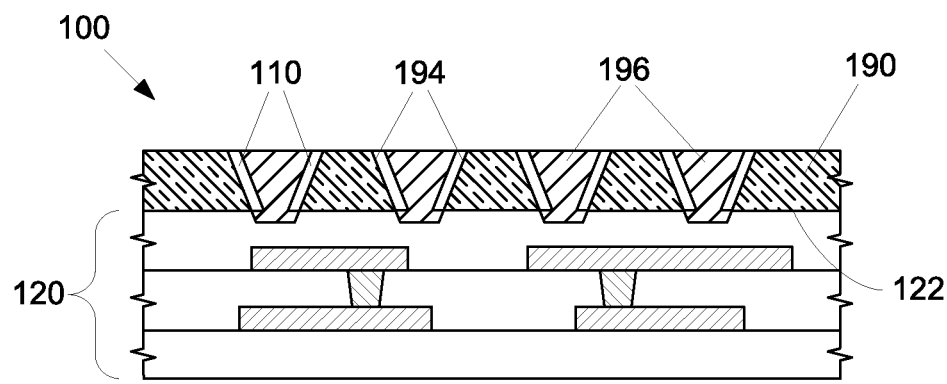

FIGS. 34-38 illustrate a laser-based process for fabricating conductive routes for an electronic substrate for an integrated circuit assembly, according to another embodiment of the present description. Beginning with the structure illustrated in FIG. 3, as shown in FIG. 34, a metal-doped dielectric layer 190 may be formed on the first surface 122 of the base substrate 120. As shown in FIG. 35, the metal-doped dielectric material layer 190 may be laser drilled to form at least one opening 192 therein, wherein the openings 192 will each have at least one sidewall 194 having a positive taper. In one embodiment of the present description, the metal-doped dielectric material layer 190 may comprise a palladium-doped dielectric. As will be understood, the metal in the metal-doped dielectric layer 190 will be activated during the laser drilling, and, thus, a metal can be selectively plated onto the sidewalls 184, thereby forming the high-density conductive routes 110, as shown in FIG. 36. In one embodiment of the present description, copper may be electrolessly plated onto the sidewalls 194. As shown in FIG. 37, a fill dielectric material layer 196 may be formed in the openings 192 (see FIG. 32) and planarized, as shown in FIG. 38.

It is noted that the laser drilling may result in the opening 192 extending into the base substrate 120 (see FIGS. 35 and 36), which will require the fill dielectric material layer 192 to fill into the base substrate 120 under the high-density conductive routes 110. In order to prevent the necessity of this underfilling, an alternate laser-based process, according to an embodiment of the present description, may be utilized, as shown in FIGS. 39-43.

Figure 39:
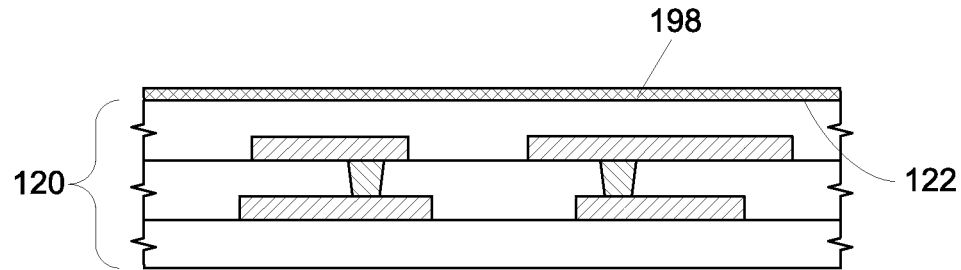
FIGS. 39-43 are side cross-sectional views of a process for the fabrication of conductive routes for an electronic substrate, according to still another embodiment of the present description.

Beginning with the structure illustrated in FIG. 3, as shown in FIG. 39, a dielectric laser stop material 198 may be formed on the first surface 122 of the base substrate 120. In one embodiment of the present description, the dielectric laser stop material 198 may comprise a metal oxide. In a specific embodiment, the dielectric laser stop material 198 may comprise titanium oxide sputtered on the first surface 122 of the base substrate 120.

Figure 40:
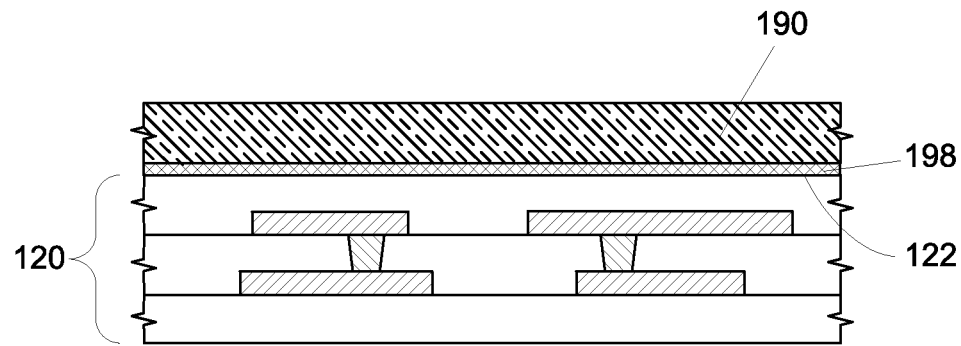
Figure 41:
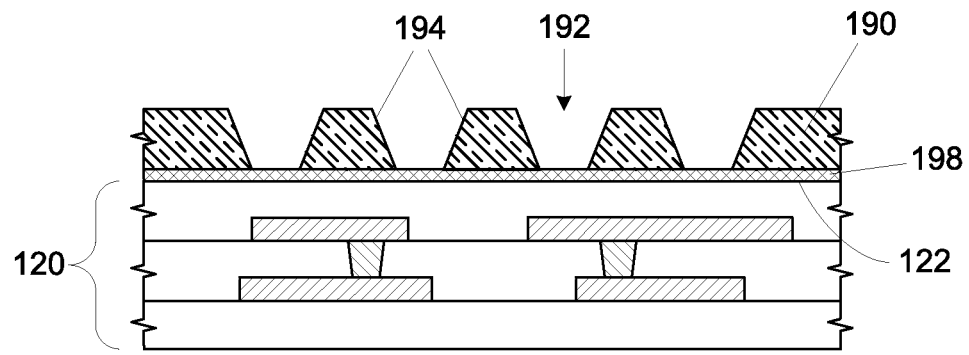
Figure 42:
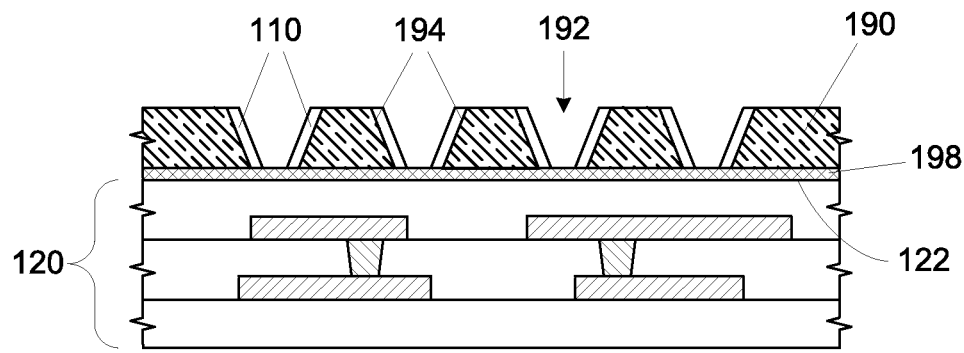
Figure 43:
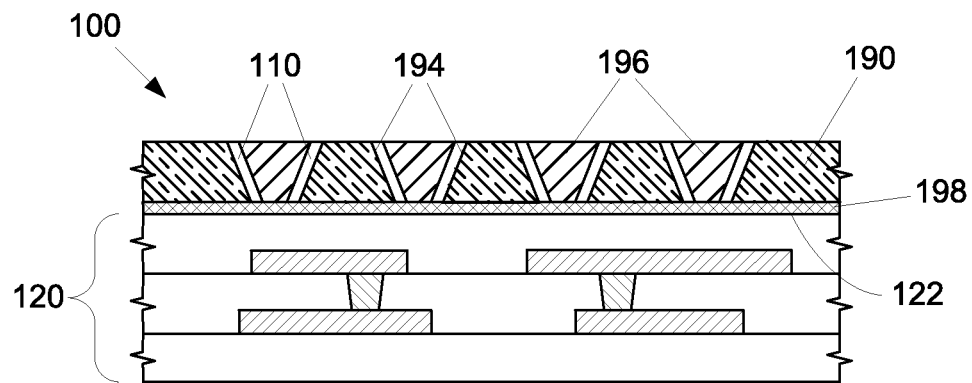

As shown in FIG. 40, the metal-doped dielectric layer 190 may be formed on the dielectric laser stop material 198. As shown in FIG. 41, the metal-doped dielectric material layer 190 may be laser drilled to form at least one opening 192 therein, wherein the openings 192 will each have at least one sidewall 194 having a positive taper and expose portions of the dielectric laser stop material 198. As previously discussed, a metal can be selectively plated onto the sidewalls 194 (activated), thereby forming the high-density conductive routes 110, as shown in FIG. 42. The fill dielectric material layer 196 may then be formed in the openings 152 (see FIG. 42) and planarized, as shown in FIG. 43.

As will be understood, although not specifically illustrated, the high-density conductive routes 110 of any embodiment of the present description may be electrically attached to the at least one conductive route 140 (see FIG. 3) within the base substrate 120.

It is noted that for all of the embodiments described with regard to FIGS. 3-43, some or all of the planarization processes may not be needed depending on the dimensions resulting from the substantially lateral plating used to form the high-density conductive routes 110 (i.e. electrical performance is sufficiently high with rounded top/non-planar surfaces) and assuming that subsequent layer formation follows traditional laser drilling for the fabrication of conductive vias, as will be understood to those skilled in the art.

It is further noted that processes of the present description will result in the patterning of pairs of parallel conductive routes. The proposed process will require "feature splitting" to sever the connections in order to form appropriate electrical connections. The features may be split utilizing either an automated optical repair method or subtractive etching through a resist. This feature splitting will result in a non-conventional design, wherein, non-functional, isolated, stand-alone, or otherwise unconnected high-density conductive routes 110 are patterned within the electronic substrate 100.

Figure 44:
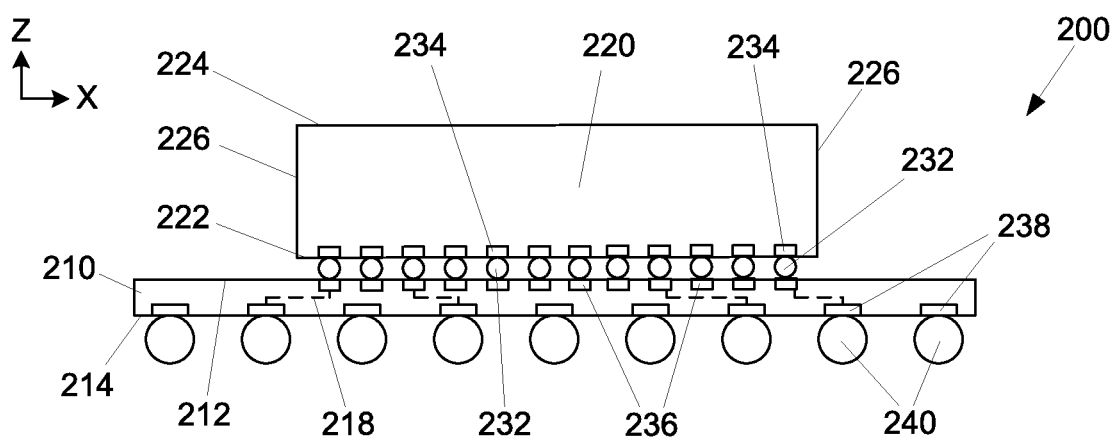
FIG. 44 is a side cross-sectional views of an integrated circuit package having an electronic substrate that contains conductive routes, according to an embodiment of the present description.

FIG. 44 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 or "metallization" (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). These conductive routes 218 may include at least one conductive route 100 of the present description, as discussed with regard to FIGS. 1-43.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 44, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

In an embodiment of the present description, the first integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 45:
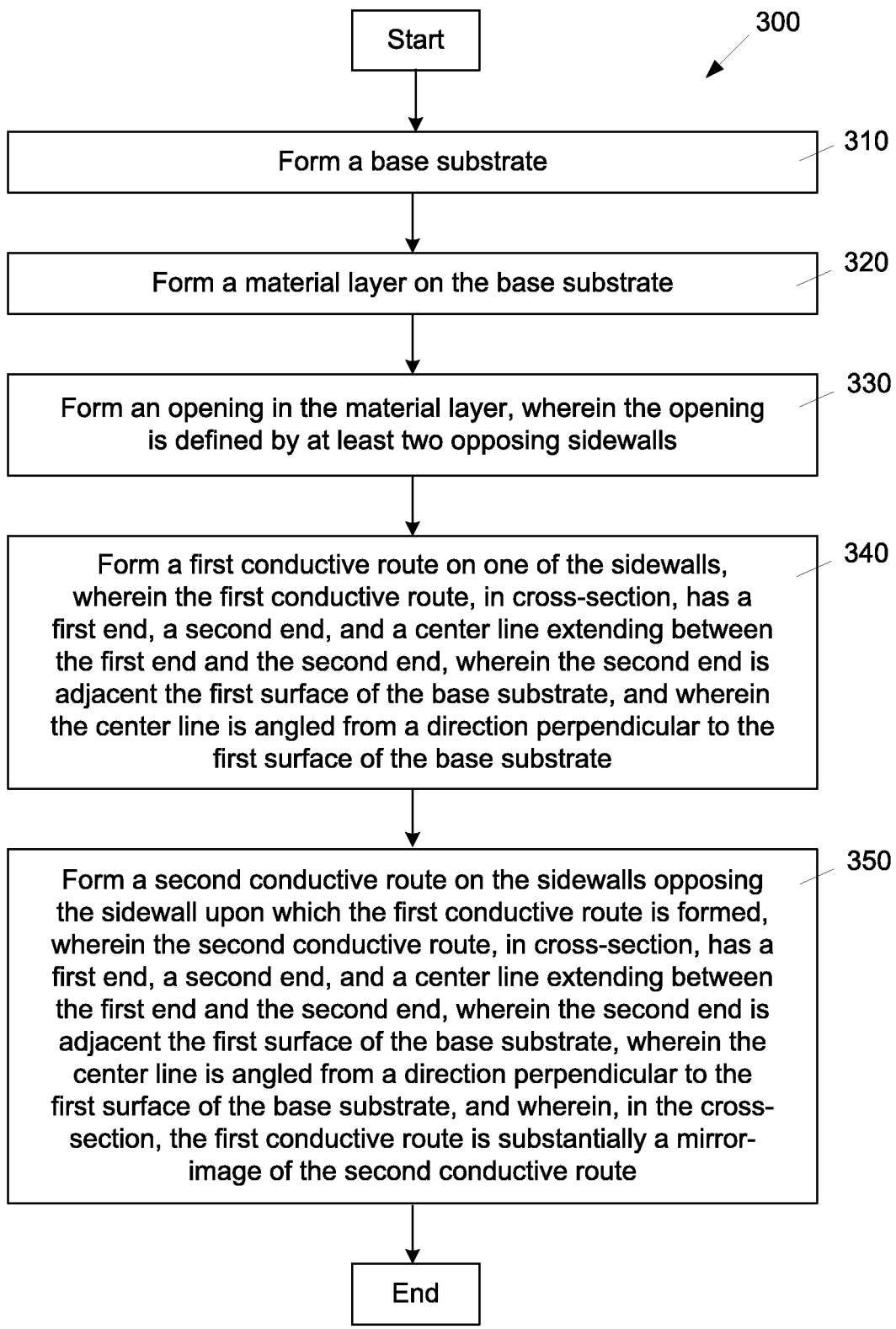
FIG. 45 is a flow chart of a process of fabricating an integrated circuit assembly, according to another embodiment of the present description.

FIG. 45 is a flow chart of a process 300 of fabricating an electronic substrate according to an embodiment of the present description. As set forth in block 310, a base substrate may be formed. A material layer may be formed on the base substrate, as set forth in block 320. As set forth in block 330, an opening may be formed in the material layer, wherein the opening is defined by at least two opposing sidewalls. A first conductive route may be formed on one of the sidewalls, wherein the first conductive route, in cross-section, has a first end, a second end, and a center line extending between the first end and the second end, wherein the second end is adjacent the first surface of the base substrate, and wherein the center line is angled from a direction perpendicular to the first surface of the base substrate, as set forth in block 340. As set forth in block 350, a second conductive route may be formed on the sidewall opposing the sidewall upon which the first conductive route is formed, wherein the second conductive route, in cross-section, has a first end, a second end, and a center line extending between the first end and the second end, wherein the second end is adjacent the first surface of the base substrate, wherein the center line is angled from a direction perpendicular to the first surface of the base substrate, and wherein, in the cross-section, the first conductive route is substantially a mirror-image of the second conductive route.

Figure 46:
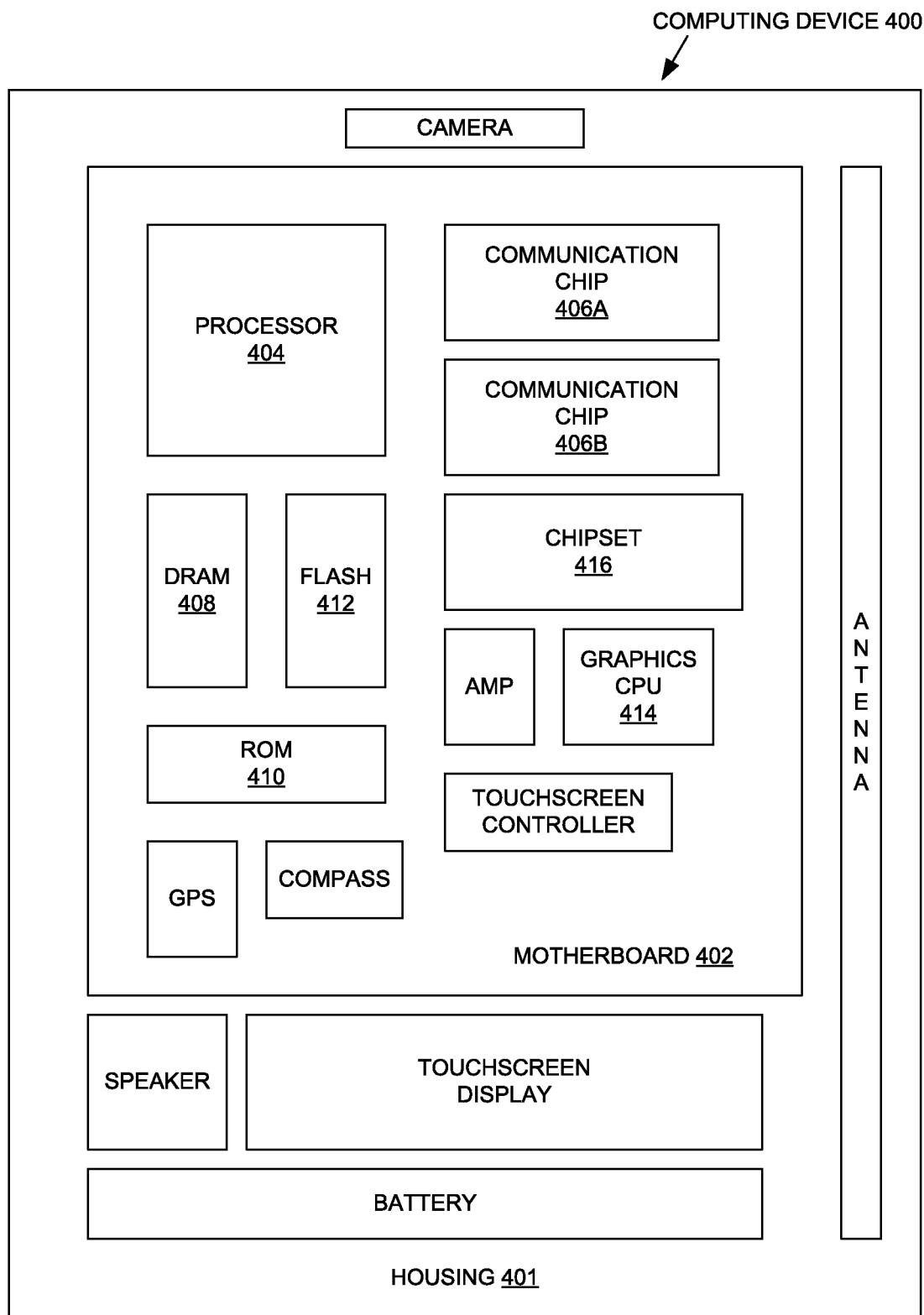
FIG. 46 is an electronic system, according to one embodiment of the present description.

FIG. 46 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising a base substrate having a first surface; a first conductive route, wherein the first conductive route, in cross-section, has a first end, a second end, and a center line extending between the first end and the second end, wherein the second end is adjacent the first surface of the base substrate, and wherein the center line is angled from a direction perpendicular to the first surface of the base substrate; and a second conductive route, wherein the second conductive route, in the same cross-section, has a first end, a second end, and a center line extending between the first end and the second end, wherein the second end is adjacent the first surface of the base substrate, and wherein the center line is angled off a direction perpendicular to the first surface of the base substrate; wherein, in the cross-section, the first conductive route is substantially a mirror-image of the second conductive route.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-46. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising a base substrate having first surface; a first conductive route, wherein the first conductive route, in cross-section, has a first end, a second end, and a center line extending between the first end and the second end, wherein the second end is adjacent the first surface of the base substrate; and a second conductive route portion, wherein the second conductive route, in the same cross-section, has a first end, a second end, and a center line extending between the first end and the second end, wherein the second end is adjacent the first surface of the base substrate, and wherein the center line is angled off a direction perpendicular to the first surface of the base substrate; wherein, in the cross-section, the first conductive route is substantially a mirror-image of the second conductive route.

In Example 2, the subject matter of Example 1 can optionally include the center line angle off the direction perpendicular to the first surface of the base substrate of both the first conductive route and the second conductive route is between about 1 degree and 45 degrees.

In Example 3, the subject matter of Example 1 can optionally include the center line angle off the direction perpendicular to the first surface of the base substrate of both the first conductive route and the second conductive route is greater than about 5 degrees.

In Example 4, the subject matter of any of Examples 1 to 3 can optionally include the first end of the first conductive route being closer to the first end of the second conductive route that the second end of the first conductive route is to the second end of the second conductive route.

In Example 5, the subject matter of any of Examples 1 to 3 can optionally include the first end of the first conductive route being farther from the first end of the second conductive route that the second end of the first conductive route is to the second end of the second conductive route.

Example 6 is an integrated circuit package comprising an integrated circuit device electrically attached to an electronic substrate, wherein the electronic substrate comprises a base substrate having first surface; a first conductive route, wherein the first conductive route, in cross-section, has a first end, a second end, and a center line extending between the first end and the second end, wherein the second end is adjacent the first surface of the base substrate; and a second conductive route portion, wherein the second conductive route, in the same cross-section, has a first end, a second end, and a center line extending between the first end and the second end, wherein the second end is adjacent the first surface of the base substrate, and wherein the center line is angled off a direction perpendicular to the first surface of the base substrate; wherein, in the cross-section, the first conductive route is substantially a mirror-image of the second conductive route.

In Example 7, the subject matter of Example 6 can optionally include the center line angle off the direction perpendicular to the first surface of the base substrate of both the first conductive route and the second conductive route is between about 1 degree and 45 degrees.

In Example 8, the subject matter of Example 6 can optionally include the center line angle off the direction perpendicular to the first surface of the base substrate of both the first conductive route and the second conductive route is greater than about 5 degrees.

In Example 9, the subject matter of any of Examples 6 to 8 can optionally include the first end of the first conductive route being closer to the first end of the second conductive route that the second end of the first conductive route is to the second end of the second conductive route.

In Example 10, the subject matter of any of Examples 6 to 8 can optionally include the first end of the first conductive route being farther from the first end of the second conductive route that the second end of the first conductive route is to the second end of the second conductive route.

Example 11 is an electronic system comprising an electronic board and an integrated circuit package electrically attached to the electronic board, wherein the integrated circuit package comprising an integrated circuit device electrically attached to an electronic substrate, wherein the electronic substrate comprises a base substrate having first surface; a first conductive route, wherein the first conductive route, in cross-section, has a first end, a second end, and a center line extending between the first end and the second end, wherein the second end is adjacent the first surface of the base substrate; and a second conductive route portion, wherein the second conductive route, in the same cross-section, has a first end, a second end, and a center line extending between the first end and the second end, wherein the second end is adjacent the first surface of the base substrate, and wherein the center line is angled off a direction perpendicular to the first surface of the base substrate; wherein, in the cross-section, the first conductive route is substantially a mirror-image of the second conductive route.

In Example 12, the subject matter of Example 11 can optionally include the center line angle off the direction perpendicular to the first surface of the base substrate of both the first conductive route and the second conductive route is between about 1 degree and 45 degrees.

In Example 13, the subject matter of Example 11 can optionally include the center line angle off the direction perpendicular to the first surface of the base substrate of both the first conductive route and the second conductive route is greater than about 5 degrees.

In Example 14, the subject matter of any of Examples 11 to 13 can optionally include the first end of the first conductive route being closer to the first end of the second conductive route that the second end of the first conductive route is to the second end of the second conductive route.

In Example 15, the subject matter of any of Examples 11 to 13 can optionally include the first end of the first conductive route being farther from the first end of the second conductive route that the second end of the first conductive route is to the second end of the second conductive route.

Example 16 is a method of fabricating an integrated circuit assembly comprising forming a base substrate having first surface; forming a material layer on the first surface of the base substrate; forming an opening in the material layer, wherein the opening is defined by at least two opposing sidewalls; forming a first conductive route, wherein the first conductive route, in cross-section, has a first end, a second end, and a center line extending between the first end and the second end, wherein the second end is adjacent the first surface of the base substrate; and forming a second conductive route portion, wherein the second conductive route, in the same cross-section, has a first end, a second end, and a center line extending between the first end and the second end, wherein the second end is adjacent the first surface of the base substrate, and wherein the center line is angled off a direction perpendicular to the first surface of the base substrate; wherein, in the cross-section, the first conductive route is substantially a mirror-image of the second conductive route.

In Example 17, the subject matter of Example 16 can optionally include the center line angle off the direction perpendicular to the first surface of the base substrate of both the first conductive route and the second conductive route is between about 1 degree and 45 degrees.

In Example 18, the subject matter of Example 16 can optionally include the center line angle off the direction perpendicular to the first surface of the base substrate of both the first conductive route and the second conductive route is greater than about 5 degrees.

In Example 19, the subject matter of any of Examples 16 to 18 can optionally include the first end of the first conductive route being closer to the first end of the second conductive route that the second end of the first conductive route is to the second end of the second conductive route.

In Example 20, the subject matter of Example 19 can optionally include forming the material layer comprising forming a photoresist material layer; wherein forming the opening comprises etching the photoresist material layer; and wherein forming the first conductive route and the second conductive route comprises forming a substantially conformal conductive material layer on the photoresist material layer including the sidewalls thereof forming a thin photoresist material on the conductive material layer; curing portions of the thin photoresist material layer not on the sidewalls; removing uncured thin photoresist material layer adjacent the sidewalls; plating a metal on the conductive material layer adjacent the sidewalls; removing the cured portions of the thin photoresist material layer; and removing the conductive material layer not on the sidewalls.

In Example 21, the subject matter of Example 19 can optionally include forming the material layer comprising forming a photoresist material layer; wherein forming the opening comprises etching the photoresist material layer; and wherein forming the first conductive route and the second conductive route comprises forming a seed material layer on the photoresist material layer including the sidewalls thereof; removing portions of the seed material not adjacent the sidewalls; and plating a metal on the seed layer adjacent the sidewalls.

In Example 22, the subject matter of Example 19 can optionally include forming the material layer comprising forming a photoresist material layer; wherein forming the opening comprises etching the photoresist material layer; and wherein forming the first conductive route and the second conductive route comprises forming a mask layer on the photoresist material layer excluding the sidewalls thereof; forming a metal on the sidewalls; and removing the mask layer.

In Example 23, the subject matter of any of Examples 16 to 18 can optionally include the first end of the first conductive route being farther from the first end of the second conductive route that the second end of the first conductive route is to the second end of the second conductive route.

In Example 24, the subject matter of Example 23 can optionally include forming the material layer comprising forming a dielectric material layer; wherein forming the opening comprises laser drilling the dielectric material layer; and wherein forming the first conductive route and the second conductive route comprises: forming a seed material layer on the dielectric material layer including the sidewalls thereof; removing portions of the seed material layer not on the sidewalls with a blanket layer sweep; and plating a metal on the seed material layer adjacent the sidewalls.

In Example 25, the subject matter of Example 23 can optionally include forming the material layer comprising forming a metal-doped dielectric material layer; wherein forming the opening comprises laser drilling the metal-doped dielectric material layer, wherein the laser drilling activates the sidewalls of the metal-doped dielectric material layer; and wherein forming the first conductive route and the second conductive route comprises selectively plating a metal on the activated sidewalls of the metal-doped dielectric material layer.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   a base substrate having a first surface;
   a first conductive route extending along and over the first surface in a first direction, wherein the first conductive route, in a cross-section orthogonal to the first direction, has a first end, a second end, and a center line extending between the first end and the second end, wherein the second end is adjacent the first surface of the base substrate, and wherein the center line is angled along the cross-section off a second direction perpendicular to the first surface of the base substrate; and
   a second conductive route extending along and over the first surface, the second conductive route parallel to and isolated from the first conductive route, wherein the second conductive route, in the cross-section, has a first end, a second end, and a center line extending between the first end and the second end, wherein the second end is adjacent the first surface of the base substrate, and wherein the center line is angled off the second direction perpendicular to the first surface of the base substrate;
   wherein, in the cross-section, the first conductive route is substantially a mirror-image of the second conductive route.

2. The integrated circuit assembly of claim 1, wherein the center line angle off the second direction perpendicular to the first surface of the base substrate of both the first conductive route and the second conductive route is between about 1 degree and 45 degrees.

3. The integrated circuit assembly of claim 1, wherein the center line angle off the second direction perpendicular to the first surface of the base substrate of both the first conductive route and the second conductive route is greater than about 5 degrees.

4. The integrated circuit assembly of claim 1, wherein the first end of the first conductive route is closer to the first end of the second conductive route than the second end of the first conductive route is to the second end of the second conductive route.

5. The integrated circuit assembly of claim 1, wherein the first end of the first conductive route is farther from the first end of the second conductive route than the second end of the first conductive route is to the second end of the second conductive route.

6. The integrated circuit assembly of claim 1, wherein the first conductive route and the second conductive route each comprises a first metal on a second metal.

7. The integrated circuit assembly of claim 6, wherein the first metal of the first conductive route is adjacent to the first metal of the second conductive route, and the second metal of the first conductive route is opposite the first metals from the second metal of the second conductive route.

8. The integrated circuit assembly of claim 7, wherein a dielectric material extends from the first metal of the first conductive route to the first metal of the second conductive route.

9. The integrated circuit assembly of claim 6, wherein the first metal is copper, and the second metal is palladium.

10. The integrated circuit assembly of claim 1, comprising:
    an integrated circuit device electrically attached to an electronic substrate comprising the base substrate, first conductive route, and second conductive route.

11. A method of fabricating an integrated circuit assembly, comprising:
    forming a material layer on a first surface of a base substrate;
    forming an opening in the material layer, wherein the opening is defined by at least two opposing sidewalls;
    forming a first conductive route on one of the sidewalls, wherein the first conductive route, in cross-section, has a first end, a second end, and a center line extending between the first end and the second end, wherein the second end is adjacent the first surface of the base substrate, and wherein the center line is angled off a direction perpendicular to the first surface of the base substrate; and
    forming a second conductive route, isolated from the first conductive route, on the sidewall opposing the sidewall upon which the first conductive route is formed, wherein the second conductive route, in the same cross-section, has a first end, a second end, and a center line extending between the first end and the second end, wherein the second end is adjacent the first surface of the base substrate, and wherein the center line is angled off a direction perpendicular to the first surface of the base substrate;
    wherein, in the cross-section, the first conductive route is substantially a mirror-image of the second conductive route.

12. The method of claim 11, wherein the center line angle off the direction perpendicular to the first surface of the base substrate of both the first conductive route and the second conductive route is between about 1 degree and 45 degrees.

13. The method of claim 11, wherein the center line angle off the direction perpendicular to the first surface of the base substrate of both the first conductive route and the second conductive route is greater than about 5 degrees.

14. The method of claim 11, wherein the first end of the first conductive route is closer to the first end of the second conductive route than the second end of the first conductive route is to the second end of the second conductive route.

15. The method of claim 14, wherein forming the material layer comprises forming a photoresist material layer; wherein forming the opening comprises etching the photoresist material layer; and wherein forming the first conductive route and the second conductive route comprises:
    forming a substantially conformal conductive material layer on the photoresist material layer including the sidewalls thereof;
    forming a thin photoresist material layer on the conductive material layer;
    curing portions of the thin photoresist material layer not on the sidewalls;
    removing uncured thin photoresist material layer adjacent the sidewalls;
    plating a metal on the conductive material layer adjacent the sidewalls;
    removing the cured portions of the thin photoresist material layer; and
    removing the conductive material layer not on the sidewalls.

16. The method of claim 14, wherein forming the material layer comprises forming a photoresist material layer; wherein forming the opening comprises etching the photoresist material layer; and wherein forming the first conductive route and the second conductive route comprises:
    forming a seed material layer on the photoresist material layer including the sidewalls thereof;
    removing portions of the seed material not adjacent the sidewalls; and
    plating a metal on the seed layer adjacent the sidewalls.

17. The method of claim 14, wherein forming the material layer comprises forming a photoresist material layer; wherein forming the opening comprises etching the photoresist material layer; and wherein forming the first conductive route and the second conductive route comprises:
    forming a mask layer on the photoresist material layer excluding the sidewalls thereof;
    forming a metal on the sidewalls; and
    removing the mask layer.

18. The method of claim 11, wherein the first end of the first conductive route is farther from the first end of the second conductive route than the second end of the first conductive route is to the second end of the second conductive route.

19. The method of claim 18, wherein forming the material layer comprises forming a dielectric material layer; wherein forming the opening comprises laser drilling the dielectric material layer; and wherein forming the first conductive route and the second conductive route comprises:
    forming a seed material layer on the dielectric material layer including the sidewalls thereof;
    removing portions of the seed material layer not on the sidewalls with a blanket layer sweep; and
    plating a metal on the seed material layer adjacent the sidewalls.

20. The method of claim 18, wherein forming the material layer comprises forming a metal-doped dielectric material layer; wherein forming the opening comprises laser drilling the metal-doped dielectric material layer, wherein the laser drilling activates the sidewalls of the metal-doped dielectric material layer; and wherein forming the first conductive route and the second conductive route comprises selectively plating a metal on the activated sidewalls of the metal-doped dielectric material layer.

* * * * *